(12) United States Patent
Eisenstadt et al.

(10) Patent No.: US 7,737,789 B2
(45) Date of Patent: Jun. 15, 2010

(54) BROADBAND ACTIVE BALUN

(75) Inventors: William Richard Eisenstadt, Gainesville, FL (US); Kooho Jung, Beaverton, OR (US); Robert M. Fox, Gainesville, FL (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 0 days.

(21) Appl. No.: 12/253,979

(22) Filed: Oct. 19, 2008

(65) Prior Publication Data

US 2010/0097154 A1 Apr. 22, 2010

(51) Int. Cl.
*H03F 3/04* (2006.01)
(52) U.S. Cl. .................................. 330/311; 330/310
(58) Field of Classification Search ................ 330/311, 330/310, 150, 98
See application file for complete search history.

(56) References Cited

U.S. PATENT DOCUMENTS

| | | | | |
|---|---|---|---|---|
| 6,492,875 B2 * | 12/2002 | Luo et al. | .................. | 330/296 |
| 7,274,258 B2 * | 9/2007 | Wang | .................. | 330/285 |
| 7,279,985 B2 * | 10/2007 | Chang et al. | .................. | 330/311 |

OTHER PUBLICATIONS

J. Yoon and W. R. Eisenstadt, "Lumped passive circuits for 5GHz embedded test of RF SoCs," *Int. Symp. Circuits and Syst.*, vol. 1, pp. I241-I244, May 2004.
W. R. Eisenstadt, et al., "On-chip microwave test circuits for production IC measurements," *64th ARFTG Microwave Measurements Conf.*, pp. 213-219, Dec. 2004.
J. Yoon and W. R. Eisenstadt, "Embedded loopback test for RE ICs," *IEEE Trans. Instrumentation and Measurement*, vol. 54, pp. 1715-1720, Oct. 2005.
A. H. Baree and I. D. Robertson, "Monolithic MESFET distributed baluns based on the distributed amplifier gate-line termination technique," *IEEE Trans. Microwave Theory Tech.*, vol. 45, pp. 118-195, Feb. 1997.
Y. Xuan and J. L. Fikart, "Computer-aided design of microwave frequency doublers using a new circuit structure," *IEEE Trans. Microwave Theory Tech.*, vol. 41, Dec. 1993.
H. Ma, et al., "Novel active differential phase splitters in RFIC for wireless applications," *IEEE Trans. Microwave Theory Tech.*, vol. 46, Dec. 1998.
M. Rajashekharaiah et al., "A new gain controllable on-chip active balun for 5GHz direct conversion receiver," 2005 *IEEE Int. on Circuits and Systems Symp. ISCAS 2005*, vol. 5, pp. 5115-5118, May 2005.
M. Goldfarb, et al., "A novel MMIC biphase modulator with variable gain using enhancement-mode FETS suitable for 3 V wireless applications," *1994 IEEE Microwave and Millimeter-Wave Monolithic Circuits Symp.*, pp. 99-102, May 1994.
H. Koizumi, et al., "A GaAs single balanced mixer MMIC with built-in active balun for personal communication systems," *1995 IEEE Microwave and Millimeter-Wave Monolithic Circuits Symp.*, pp. 77-80, May 1995.

(Continued)

*Primary Examiner*—Henry K Choe
(74) *Attorney, Agent, or Firm*—Saliwanchik, Lloyd & Saliwanchik

(57) ABSTRACT

A broadband active balun configuration is provided. According to embodiments, the subject active balun can include a cascade and cascade transistor pair using a shared input transistor. In a further implementation, a low-pass bias-feedback mechanism for maintaining stable bias conditions can be provided.

12 Claims, 13 Drawing Sheets

OTHER PUBLICATIONS

T. Hiraoka, et al., "A miniaturized broad-band MMIC frequency doubler," *IEEE Trans. on Microwave Theory Tech.*, vol. 38, pp. 1932-1937, Dec. 1990.

M. Kawashima, et al., "A novel broadband active balun", *33rd European Microwave Conf.*, vol. 2, pp. 495-498, Oct. 2003.

D. E. Bockelman and W.R. Eisenstadt, "Combined differential-and common mode scattering parameters: Theory and simulation," *IEEE Trans. Microwave Theory Tech.*, vol. 43, Jul. 1995.

K. Jung, W. R. Eisenstadt, and R. Fox., "Broadband active balun using combined cascode-cascade configuration" Thesis submitted Nov. 9, 2007 based at least in part on Ph.D defense by K. Jung on Oct. 18, 2007.

\* cited by examiner $[S]_D, [Y]_D$ $[S]_P, [Y]_P$ $[S]_A, [Y]_A$

BROADBAND ACTIVE BALUN

The subject invention was made with government support under Contract No. HR0011-07-3-0002 awarded by DARPA. The government has certain rights in this invention.

BACKGROUND OF THE INVENTION

In general, active baluns are unidirectional converters between differential and single-ended signals, and passive baluns are bi-directional converters between differential and single-ended signals. Active baluns are typically used for applications requiring large bandwidth. The bandwidth's upper-end frequency of an active balun depends on the technology's speed, while the lower-end frequency, although limited by DC-decoupling capacitors in the ports, can potentially extend to DC. Such unbounded lower-end frequency enables active baluns to be realized in limited chip-areas, which enables the active baluns to be suitable for Built-in Self Test (BIST) applications, as well as general differential circuits requiring compact sized broadband baluns.

Of interest for radio frequency, millimeter wave and other high frequency applications are the bandwidth capabilities, size, and cost of a particular balun configuration.

In a given CMOS or Bipolar process, the distributed amplifier configuration produces the largest bandwidth. In a distributed amplifier, the gain-bandwidth product is increased by paralleling several FETs without paralleling their input or output capacitances, thus achieving operation over extremely wide bandwidths. However, the distributed amplifier configuration occupies a fairly large area of at least 1 mm×2 mm, which increases costs. A suitable approach for limited chip-areas is the differential amplifier type configuration, which is most commonly used due to its large common-mode rejection. In a differential amplifier configuration, a common input is provided to a differential amplifier, which in turn supplies two outputs. The harmonic components can be suppressed by the amplifier due to its common mode rejection characteristics. However at high frequencies, the two outputs become unbalanced because they travel through different number of stages from the common input. A series LC-network can be used to compensate for the mismatched phase and enable gain and phase adjustment, but this sacrifices the bandwidth's lower-end frequency.

Matching the number of stages of a signal path can be achieved by using a source-drain output configuration. This still has some critical inherent problems, such as low dynamic range and the requirement of a second gain stage to simultaneously fulfill the required gain and 50 Ωmatching at each port of the differential output. The more critical problem is in the relative phase of the differential output at high frequencies, because the drain's output has an additional pole and an additional negative-zero compared to that of the source's output.

One method for achieving balanced phase at high frequencies is to use common-source and common-gate pair type. In such an active balun device, an input signal is provided to sources and gates of common gate and source FETs, and an output signal is derived at drains of the FFTs, provided a phase difference of 180° at the two outputs. However, process and parasitic components can greatly affect the bandwidth. Using this configuration, the relative phase can maintain 180° at high frequencies beyond the first few poles. However, a new challenge exists for matching the input, due to its high parasitic capacitance from driving two transistors (one for common-source path and the other one for common-gate path) that in most designs are accompanied by a third transistor from a current-source for biasing the common-gate's stage.

Accordingly, active baluns continue to require additional research and improvement for high frequency and broadband applications.

BRIEF SUMMARY

Embodiments of the present invention relate to an active balun. Implementations of an active balun in accordance with the present invention are provided that are capable of performing over a broad bandwidth while being applicable to limited chip areas.

One aspect of the present invention is to provide an active balun configuration of a cascode and cascade pair using a shared input transistor. In another aspect of the present invention, an attached low frequency feedback network can be provided for improved stability.

Embodiments of the present invention are applicable to wireless or wired circuits, general RF measurement equipment and products related to built-in self-test (BIST) and embedded test applications.

BRIEF DESCRIPTION OF THE DRAWINGS

FIG. 6A is a plot of the magnitude of $s_{13}$ and $s_{23}$; FIG. 6B is a plot of the phase of $s_{13}$ and $s_{23}$; and FIG. 6C is a plot of other undesired s-parameters.

FIG. 10A shows a set-up for an unknown through between P3 and P1; and FIG. 10B shows a set-up for an unknown through between P3 and P2.

FIG. 11A shows a block diagram of an active balun with pads; FIG. 11B shows a block diagram of pads only; and FIG. 11C shows a block diagram of an active balun without pads.

FIG. 20A shows a plot of the magnitude of the s-parameters; FIG. 20B shows a plot of the phase of the $s_{13}$ and $s_{23}$; and FIG. 20C shows a plot of the stability response.

DETAILED DISCLOSURE

Figure 1:
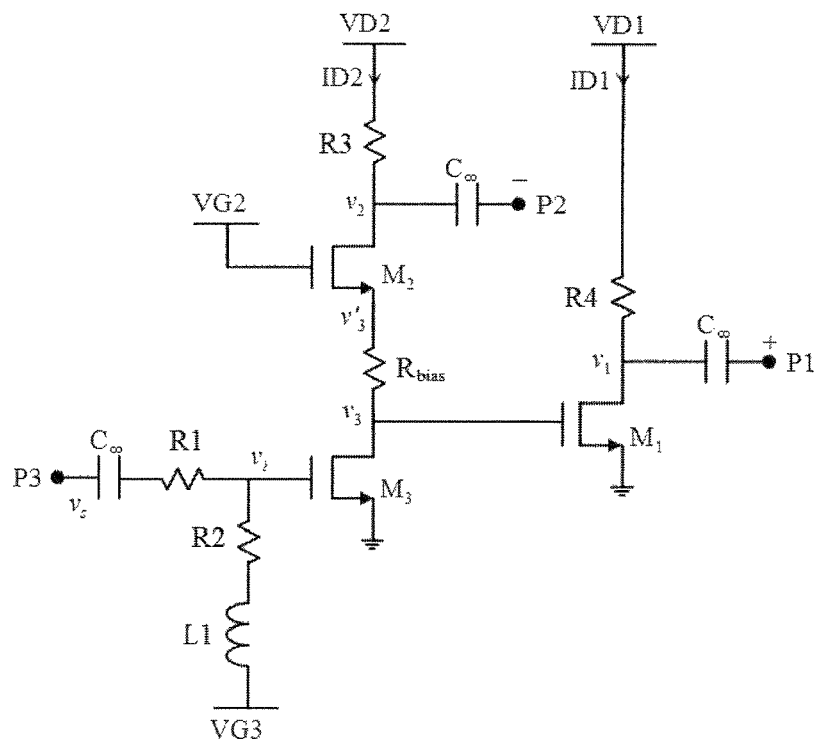
FIG. 1 shows a schematic of an active balun using combined cascode-cascade configuration (C3-balun) according to an embodiment of the present invention.

Embodiments of the present invention relate to active baluns. Embodiments of the subject active baluns can be used for radio frequency and millimeter wave applications, and Built-in Self Test (BIST) and embedded test applications. An implementation of an active balun according to an embodiment of the present invention can use a cascade and cascade pair configuration with a shared input transistor. A further implementation can include a low-pass bias-feedback network for stabilizing the transconductances of transistors of the active balun.

It is to be understood that the figures and descriptions of embodiments of the present invention have been simplified to illustrate elements that are relevant for a clear understanding of the invention, while eliminating, for purposes of clarity, other elements that may be well known. Those of ordinary skill in the art will recognize that other elements may be desirable and/or required in order to implement the present invention. However, because such elements are well known in the art, and because they do not facilitate a better understanding of the present invention, a discussion of such elements is not provided herein. In addition, not all elements illustrated in the drawings must be included and limited to the present disclosure, but the elements except essential features of the present disclosure may be added or deleted.

According to embodiments, the subject active balun (C3-balun) can include a cascade and cascade transistor pair using a shared input transistor. The cascaded non-inverting path for $s_{13}$ is combined with a cascoded inverting path for $s_{23}$, using a common input stage transistor. Compared to the previous common-source and common-gate pair configuration, higher reverse-isolation and a broader frequency range for input matching is available due to the reduced parasitic capacitance at the input port.

Referring to FIG. 1, an active balun can be provided with an input port P3 for receiving an external signal, a cascoded transistor pair ($M_3$ and $M_2$) providing a phase inverting output at port P2, and a cascaded transistor pair ($M_3$ and $M_1$) providing a non-inverting output at port P1, where the cascoded transistor pair and the cascaded transistor pair share the input stage transistor $M_3$. The broadband input matching can be further enhanced by using a divided input load. That is, a first resistor R1 can be provided in series between the input port P3 and the gate of the common input stage transistor $M_3$, and a second resistor R2 can be provided between the gate of the common input stage transistor $M_3$ and a gate voltage VG3. In addition, an inductor L1 can be included in series between the second resistor R2 and the gate voltage VG3. The inductor L1 can be used to achieve inductive peaking for maximizing the bandwidth's upper-end frequency. The reduction of the input signal from the divided load can be compensated by increasing the size of the common input stage transistor $M_3$. Although increasing the size of the common input stage transistor $M_3$ increases the gate-capacitance, a broader input matching can be achieved due to the separated R1, which is free from being shunted by the increased gate-capacitance.

According to an embodiment, DC-decoupling capacitors can be omitted from the circuit except for at the port terminals. By omitting the DC-decoupling capacitors, the balun's bandwidth can be extended on its lower-end frequency as close to DC as possible. However, from the design and optimization standpoint, the selection of bias-points is not as convenient. The biggest challenge is deciding on the bias point for $v_3$, since it influences all three transistors $M_1$, $M_2$, and $M_3$ simultaneously. According to an embodiment, a bias resistor $R_{bias}$ can be provided between the source of the second transistor $M_2$ and the drain of the common input stage transistor $M_3$ to enable additional design freedom. The bias resistor $R_{bias}$ allows the bias point at the source of the second transistor $M_2$ to be different from the bias point $v_3$ at the drain of the common input stage transistor $M_3$ and the gate of the third transistor $M_1$.

The internal bias points of the C3-balun have significant affects to the performance of the circuit, especially on the gain and the dynamic range. Minor process variations of the transistors $M_1$, $M_2$, and $M_3$ may result in alternate bias points, which can significantly change the transmission gains of the circuit.

Therefore, in further embodiments, a low-pass bias-feedback mechanism for maintaining stable bias conditions regardless of process variations can be provided. The low pass bias-feedback network can stabilize the transconductances of the transistors, by which the circuit maintains balanced output signals despite the process variations. In one such embodiment, a low-pass bias-feedback network can be implemented such as shown in FIG. 2.

Figure 2:
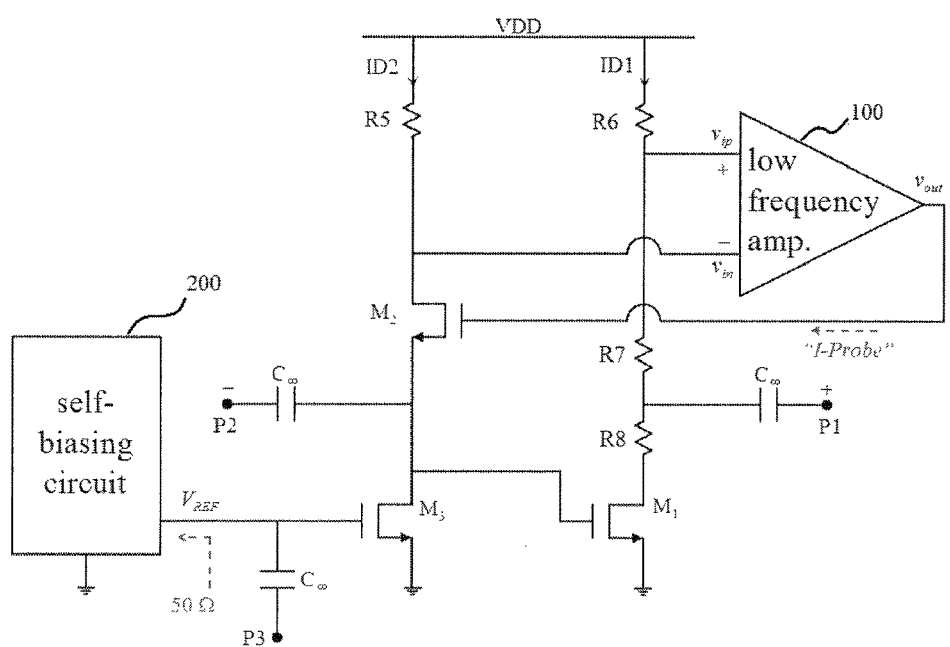
FIG. 2 shows a schematic of a C3-balun with network for stable biasing according to an embodiment of the present invention.

Referring to FIG. 2, the drain currents ID2 (for $M_2$ and $M_3$) and ID1 (for $M_1$) can be matched using a low frequency amplifier 100 connected to provide feedback to the gate of the second transistor $M_2$. A fifth resistor R5 at the source of the second transistor $M_2$ can be connected between VDD and the negative input $v_{in}$ of the low frequency amplifier 100. In addition, a sixth resistor R6 can be connected between VDD and the positive input $v_{ip}$ of the low frequency amplifier 100. The fifth resistor R5 and the sixth resistor R6 can have the same resistance value. The DC values for the negative input $v_{in}$ and the positive input $v_{ip}$ of the low frequency amplifier can match each other due to the large low-frequency gain of the loop formed by the low-frequency amplifier 100 (from $v_{ip} \rightarrow v_{out} \rightarrow$ source-follower of $M_2 \rightarrow$ common-source of $M_1 \rightarrow$ back to $v_{ip}$). In one implementation (see FIG. 17), the loop gain can be 18 dB.

Figure 3:
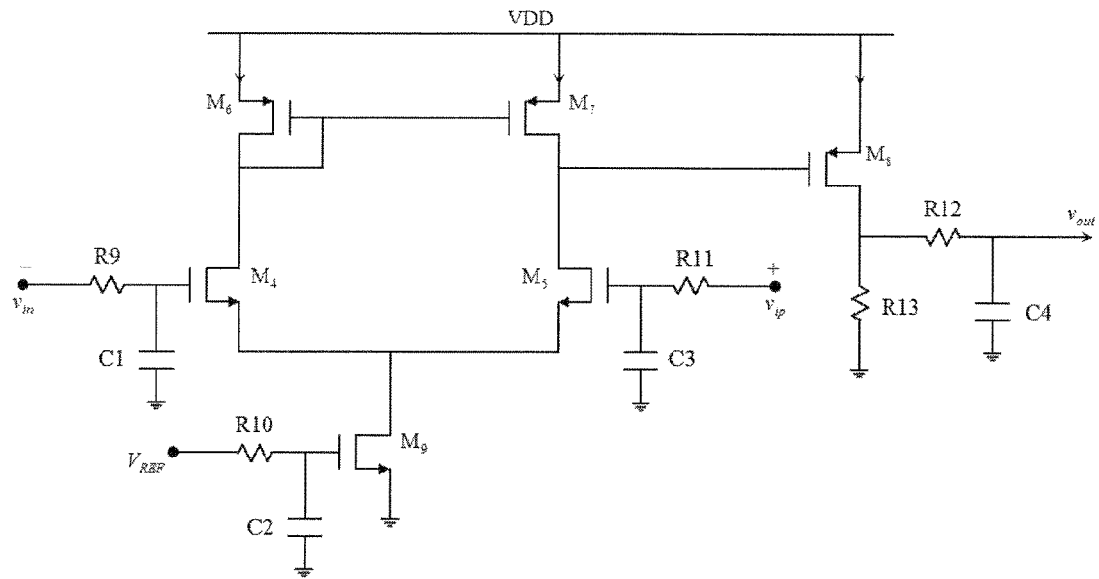
FIG. 3 shows a schematic of a low frequency amplifier used for a low-pass bias-feedback network in the C3-balun according to an embodiment of the present invention.

The circuit diagram for the low-frequency amplifier 100 according to an embodiment is shown in FIG. 3. The matching of the drain currents enables the matching of the transconductances of $M_3$ and $M_1$, which results in the matching of $s_{13}$ and $s_{23}$. Therefore, regardless of process variations of the transistors, the matching of the drain currents can be achieved. Referring to FIG. 3, the low frequency amplifier 100 can include a differential pair ($M_4$ and $M_5$) with a current mirror load ($M_6$ and $M_7$) and a source biasing reference transistor $M_9$, and an output buffer ($M_8$).

Figure 4:
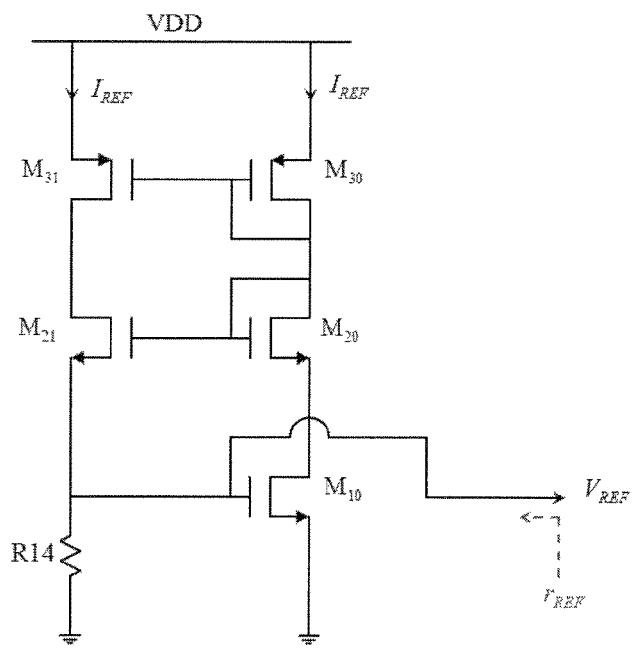
FIG. 4 shows a schematic of a threshold-referenced self-biasing network used in the C3-balun and the attached low-pass bias-feedback network according to an embodiment of the present invention.

Referring again to FIG. 2, the low-pass bias-feedback network controls the matching of $s_{13}$ and $s_{23}$, but does not directly control their magnitudes. The values of the magnitudes of $s_{13}$ and $s_{23}$ are matched by matching the node voltages of $v_{ip}$ and from $v_{in}$, which in turn provide the matched bias currents of ID1 and ID2. Accordingly, to control the bias currents, a self-biasing circuit 200 can be attached. The self-biasing circuit 200 can provide a reference current $I_{REF}$, which delivers $V_{REF}$ to the C3-balun. FIG. 4 shows an embodiment of a self-biasing circuit 200 that can be incorporated in the subject C3-balun.

The self-biased $I_{REF}$ is independent of VDD, and can be given by the following equation:

$$I_{REF} = \frac{V_{TH10}}{B_{10} \cdot (R14) - 1}; \text{ and}$$

$I_{REF} = B_{10}(V_{REF} - V_{TH10})$, where $V_{TH10}$ is the threshold of $M_{10}$ and $B_{10}$ is from the large signal equations for a short-channel NMOS transistor operating in saturation.

As shown in FIG. 2, the C3-balun utilizing the low frequency amplifier 100 and self-biasing circuit 200 is slightly modified from the embodiment illustrated in FIG. 1. The modification allows for use of a constant VDD instead of VD1 and VD2. In addition, modifications can be made to accommodate for the increased parasitic capacitance associated with the attached self-biasing circuit 200 and the low frequency amplifier 100. In certain embodiments, inductors can be completely omitted from the design. In another embodiment, an on-chip inductor can be included, connected in series with R14 of the self-biasing circuit shown in FIG. 3.

Advantageously, embodiments of the subject balun can be used in BIST applications and any general circuit requiring compact sized broadband baluns.

EXAMPLE 1

Figure 5:
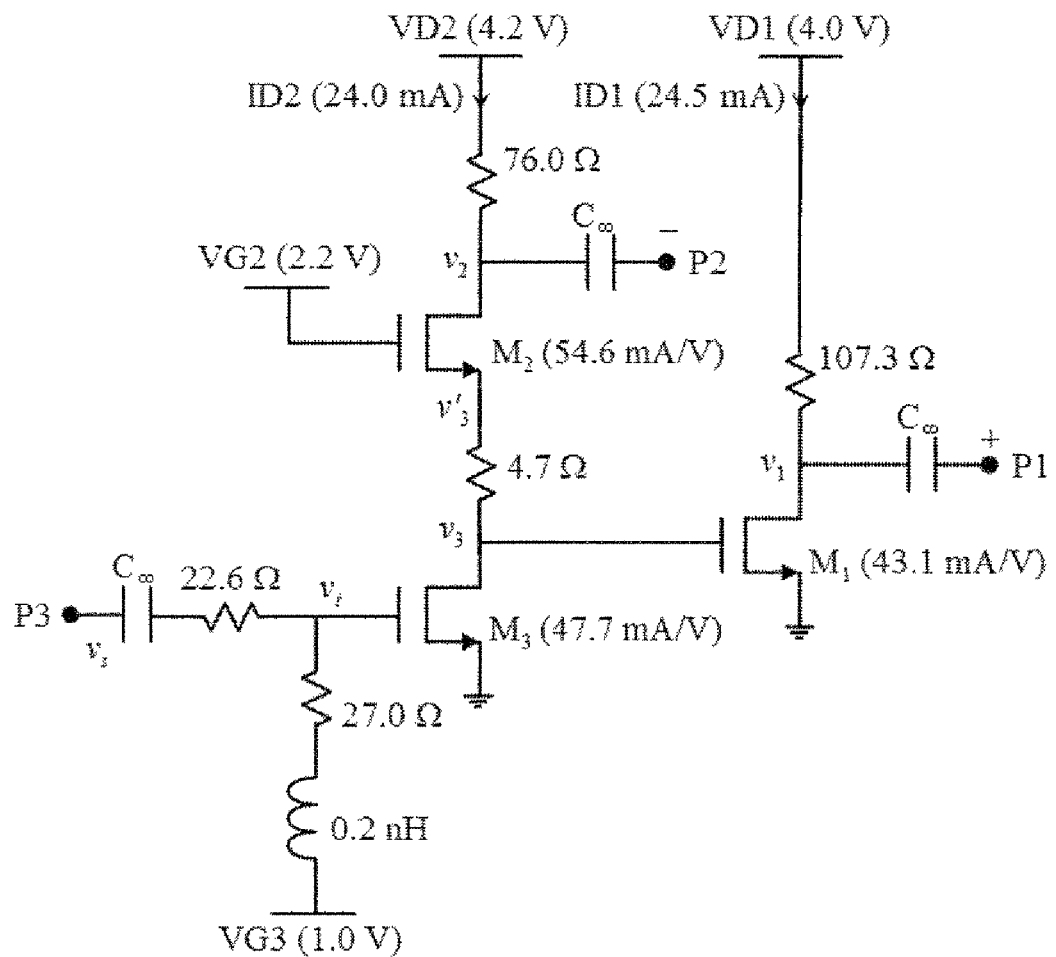
FIG. 5 shows a schematic of a specific implementation of the C3-balun shown in FIG. 1.

In a specific example implementation, a source-type active balun is provided. The active balun configuration uses a cascode and cascade pair with the shared input transistor. The schematic for the C3-balun is shown in FIG. 5, where the transconductance for each transistor is annotated in parenthesis. The broadband input matching can be further enhanced by dividing the input's 50 Ω resistance into 22.6 Ω and 27.0 Ω, where the remaining 0.3 Ω is from the parasitic resistance of the 0.2 nH inductor. The dividing of the 50 Ω resistance can reduce the input signal, but requires the increase of the size of $M_3$. An $R_{bias}$ of 4.7 Ω is introduced to enable additional design freedom, so that bias point of $M_2$'s source, $v'_3$, can be chosen to be different from that of $M_3$'s drain and $M_1$'s gate, $v_3$. The bias-points are optimally chosen for the circuit to operate up to 5 dBm of the input power, while maintaining all transistors to operate in the saturation-mode and remain safe from gate-drain and gate-source oxide breakdown. The designed bias-points and the simulated AC voltage swings (peak values) are shown in Table 1.

TABLE 1

C3-balun's internal bias points and AC voltage swings at 5 dBm input

| Nodes | DC bias points | AC voltage swings (peak) | Result voltage swings |
|---|---|---|---|
| $v_s$ | — | 0.56 V | — |
| $v_i$ | 1.00 V | 0.31 V | 0.69~1.31 V |
| $v_3$ | 1.05 V | 0.31 V | 0.74~1.36 V |
| $v'_3$ | 1.16 V | 0.25 V | 0.91~1.41 V |
| $v_2$ | 2.36 V | 0.40 V | 1.96~2.76 V |
| $v_1$ | 1.39 V | 0.40 V | 0.99~1.79 V |

In this example implementation the above described optimization results in large biases for VDD's as high as 4.2 V. However, these values can be reduced if the design is aimed for less operational power.

Figure 6A:
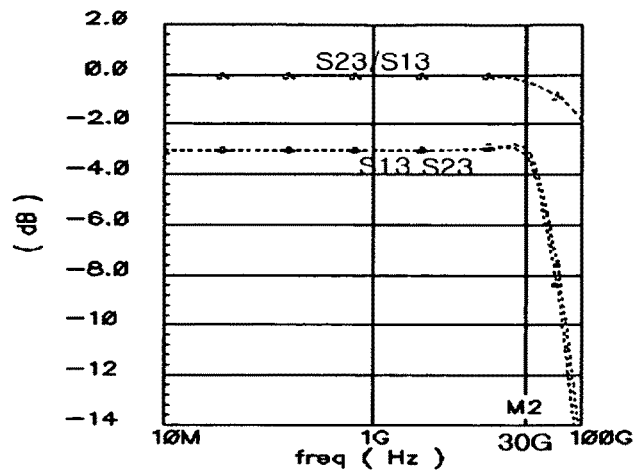
FIGS. 6A-6C show simulation results of a C3-balun according to an embodiment of the present invention.
Figure 6B:
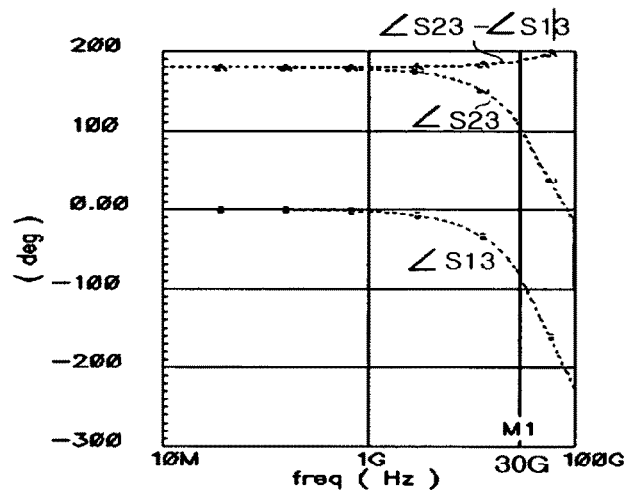
Figure 6C:
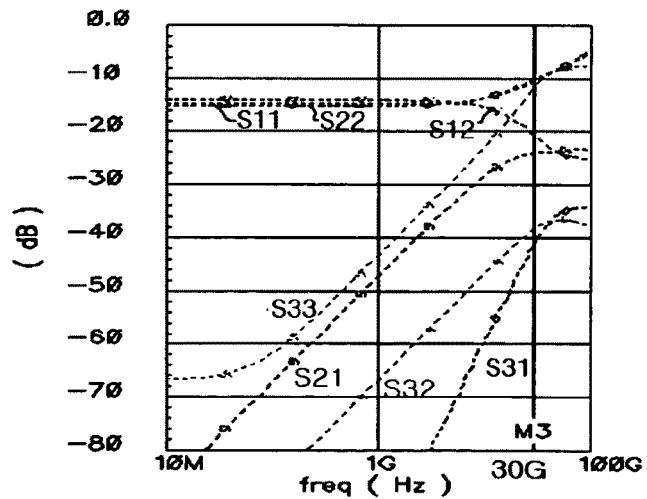

The simulation result of the proposed C3-balun is shown in FIGS. 6A-5C. It shows that the two forward gains maintain −3 dB with opposite polarities from 10 MHz up to 30 GHz. All other undesired s-parameters, such as reflections and isolations, are all shown to be less then −10 dB up to 30 GHz.

Figure 7:
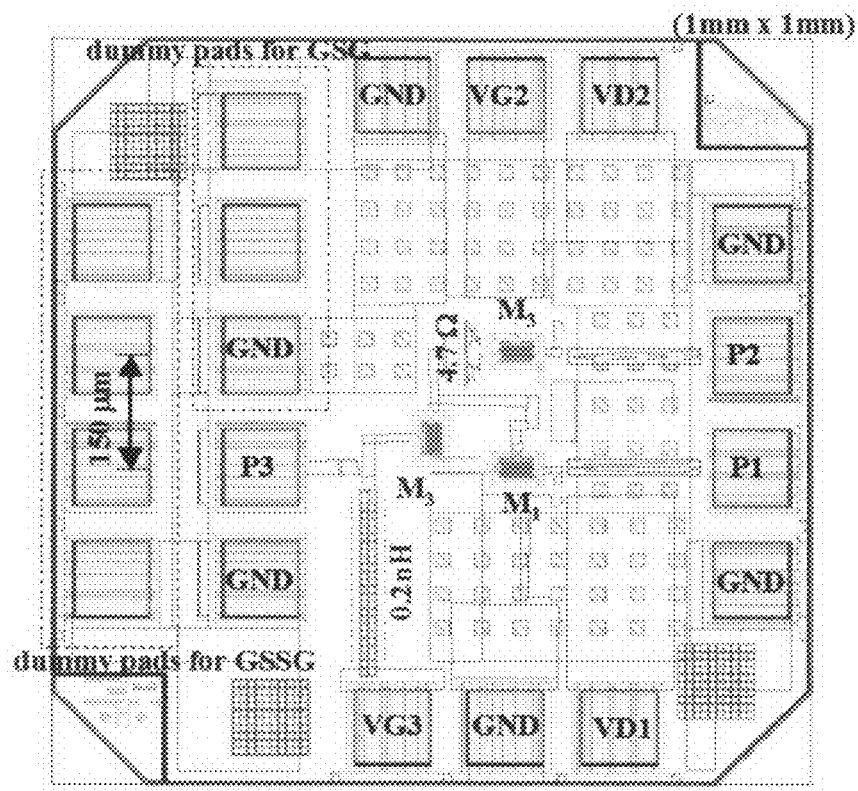
FIG. 7 shows a chip layout of a C3-balun according to an embodiment of the present invention in IBM 8HP 130 nm BiCMOS process.
Figure 8:
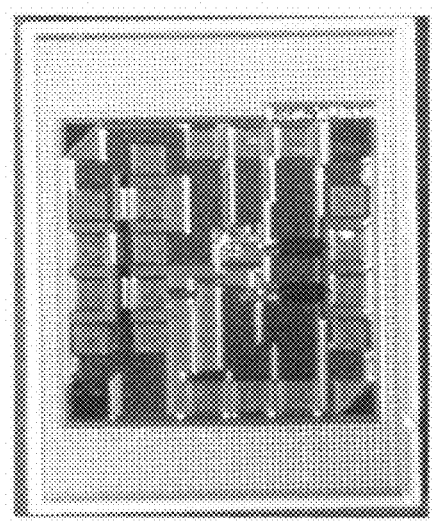
FIG. 8 is a photograph of a chip of a C3-balun according to an embodiment of the present invention in IBM 8HP 130 nm BiCMOS process.

For the example, the active balun is manufactured in the IBM 8HP 130 nm BiCMOS process. The layout is shown in FIG. 7 and the manufactured chip is shown in FIG. 8. The "dummy pads" are placed for calibrating out the pads' effects. Furthermore, by replacing the 0.2 nH line-inductor into an "Ω"-shaped inductor, the compacted version of the layout can be as small as 0.2 mm×0.2 mm (without including the pads). This compacted layout allows for incorporation of the subject balun in circuits requiring compact sized broadband baluns and BIST applications.

Figure 9:
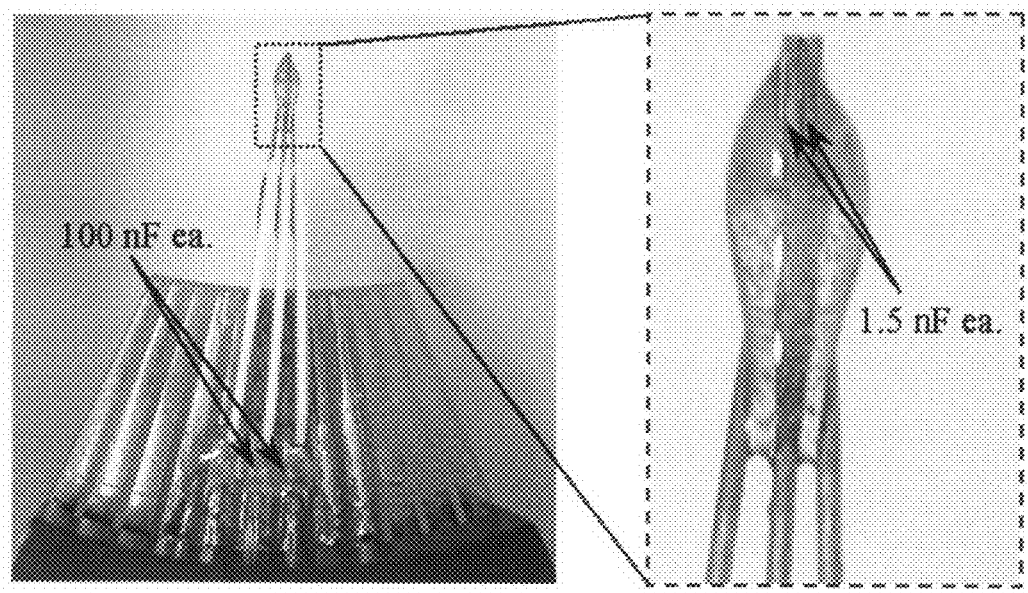
FIG. 9 shows a three-pin DC-probe with embedded bypass capacitors.

Test measurements of the fabricated C3-balun of FIG. 8, where conducted using Rohde & Schwarz's ZVA40, where the on-wafer RF probing and calibrations were conducted using Cascade Microtech's Infinity Probe Series (GSG for P3 and GSSG for P1 and P2, where "G" stands for ground and "S" stands for RF signal), and their Impedance-Standard-Substrate (ISS) P/N's 005-016 (for GSG) and 129-246 (for GSSG). Referring to FIG. 9, the DC biasing can be performed using GGB's DC probes with bypass chip capacitors embedded at the tip and the rear to provide stable biases through out the frequency range of 10 MHz~40 GHz. These capacitors are embedded because the on-chip capacitors of this example implementation cannot be made large enough to bypass the frequency components less than 1 GHz.

Figure 10A:
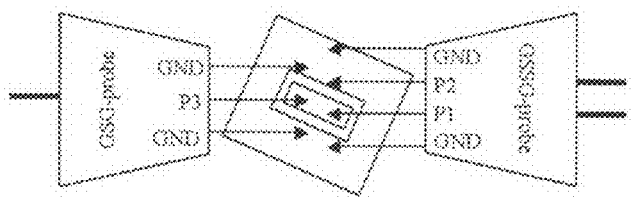
FIGS. 10A-10B show set-ups of a GSG (ground-signal-ground probe) "through" pattern for unknown-through measurements.
Figure 10B:
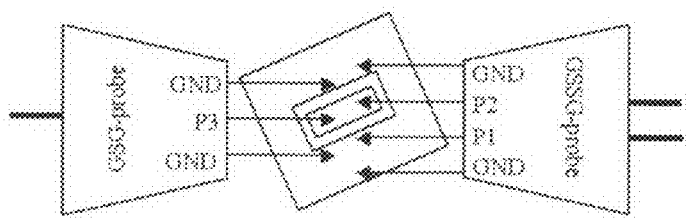

In calibrating for a 3-port measurement, the "through" measurements between the GSG and the GSSG are performed with no floating grounds (G's) to achieve accurate calibrations up to tens of GHz. This can be accomplished by using "unknown through"—"open"—"short"—"match" (UOSM) algorithm. FIGS. 10A and 10B illustrate the tilting of GSG through patterns of the ISS P/N 005-016 to measure the "unknown through" between GSG (P3) and the GSSG (P1 or P2).

Figure 11A:
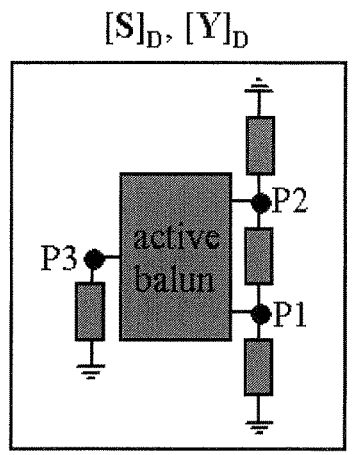
FIGS. 11A-11C show block schematics for full 3×3 s-parameter and y-parameter matrices.
Figure 11B:
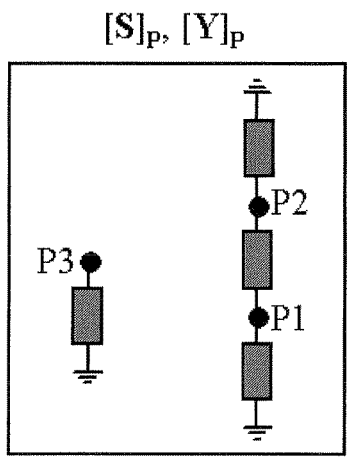
Figure 11C:
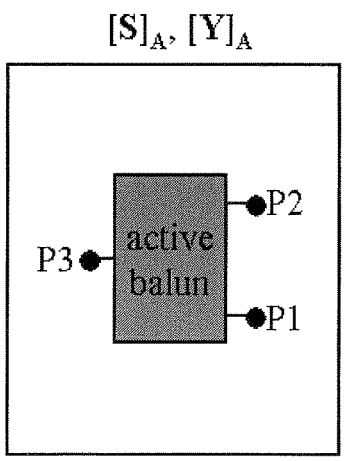

To calibrate out the pads' effects on the measurements, a calibration set up is provided as shown by FIGS. 11A-11C. The measured s-parameters of the active balun with pads ($[s]_D$) (FIG. 11A) and those of the pads obtained by measuring the dummy pads ($[s]_P$) (FIG. 11B), are respectively converted into y-parameters of $[y]_D$ and $[y]_P$. From this, the y-parameters of active balun (without pads) (FIG. 11C) can be obtained by $[y]_A = [y]_D - [y]_P$, which can be converted back to its s-parameters, $[s]_A$. The conversion between the s-parameters and y-parameters of a 3-port network can be derived from their definitions as shown in Equations (1) and (2) below. The relationship between the s-parameters' powerwaves, and the y-parameters' v's and i's (where it is defined to direct inwards to the network) are shown in Equations (3) and (4). By inserting Equation (3) into Equation (1) and inserting Equation (4) into Equation (2), the conversion equations between the two parameters can be derived as Equations (5) and (6).

$$\begin{pmatrix} b_1 \\ b_2 \\ b_3 \end{pmatrix} = \begin{pmatrix} s_{11} & s_{12} & s_{13} \\ s_{21} & s_{22} & s_{23} \\ s_{31} & s_{32} & s_{33} \end{pmatrix} \cdot \begin{pmatrix} a_1 \\ a_2 \\ a_3 \end{pmatrix} \equiv [s] \cdot \begin{pmatrix} a_1 \\ a_2 \\ a_3 \end{pmatrix} \quad (1)$$

$$\begin{pmatrix} i_1 \\ i_2 \\ i_3 \end{pmatrix} = \begin{pmatrix} y_{11} & y_{12} & y_{13} \\ y_{21} & y_{22} & y_{23} \\ y_{31} & y_{32} & y_{33} \end{pmatrix} \cdot \begin{pmatrix} v_1 \\ v_2 \\ v_3 \end{pmatrix} \equiv [y] \cdot \begin{pmatrix} v_1 \\ v_2 \\ v_3 \end{pmatrix} \quad (2)$$

$$\begin{pmatrix} a_k \\ b_k \end{pmatrix}_{k=1\sim3} = \begin{pmatrix} \frac{1}{2\sqrt{z_0}} & \frac{\sqrt{z_0}}{2} \\ \frac{1}{2\sqrt{z_0}} & -\frac{\sqrt{z_0}}{2} \end{pmatrix} \cdot \begin{pmatrix} v_k \\ i_k \end{pmatrix} \quad (3)$$

$$\begin{pmatrix} v_k \\ i_k \end{pmatrix}_{k=1\sim3} = \begin{pmatrix} \sqrt{z_0} & \sqrt{z_0} \\ \frac{1}{\sqrt{z_0}} & -\frac{1}{\sqrt{z_0}} \end{pmatrix} \cdot \begin{pmatrix} a_k \\ b_k \end{pmatrix} \quad (4)$$

$$[y] = \frac{1}{z_0} \cdot [[I] + [s]]^{-1} \cdot [[I] - [s]] \quad (5)$$

$$[s] = [[I] + z_0 \cdot [y]]^{-1} \cdot [[I] - z_0 \cdot [y]] \quad (6)$$

Figure 12:
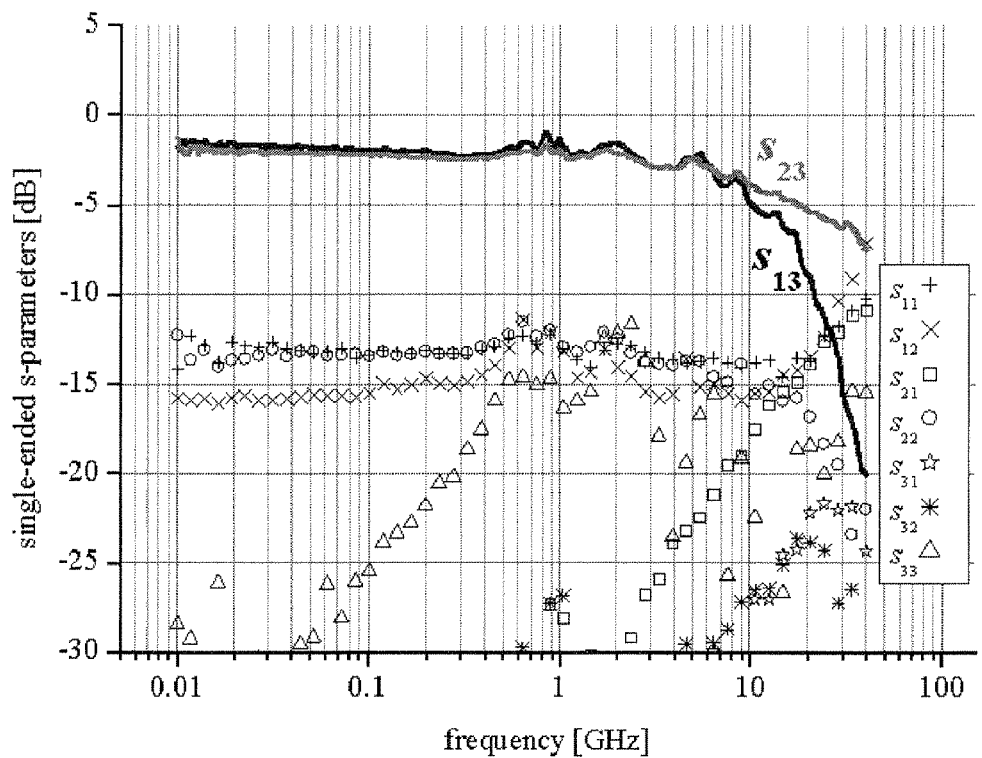
FIG. 12 shows a plot of measured magnitude of the single-ended s-parameters of the C3-balun according to an embodiment of the present invention at the input power of −25 dBm.
Figure 13:
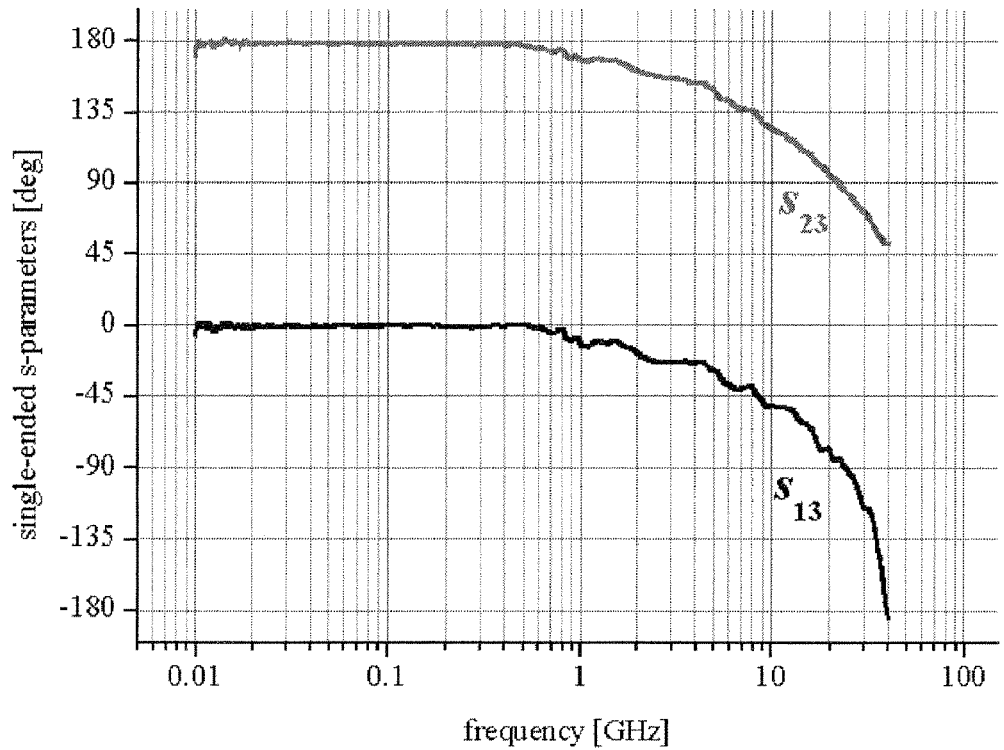
FIG. 13 shows a plot of measured phase of the single-ended s-parameters of the C3-balun according to an embodiment of the present invention at the input power of −25 dBm.

The single-ended measurement of the example C3-balun is shown in FIG. 12. Referring to FIG. 12 and FIG. 6A, the forward gains of the fabricated C3-balun are 1 dB~1.5 dB higher than that of the simulation. These are most possibly due to increased load resistances caused by the parasitic routing resistance, which can be addressed by post layout simulations. The phases of the forward gains are shown in FIG. 13, where their relative phase maintains 180° (±10°) up to 30 GHz. This is well beyond the point in which the gain starts to decrease, which cannot be achieved using the previous source-drain output type active baluns. The other undesired s-parameters such as the reflections and the isolations are all less then −10 dB up to 30 GHz.

Figure 14:
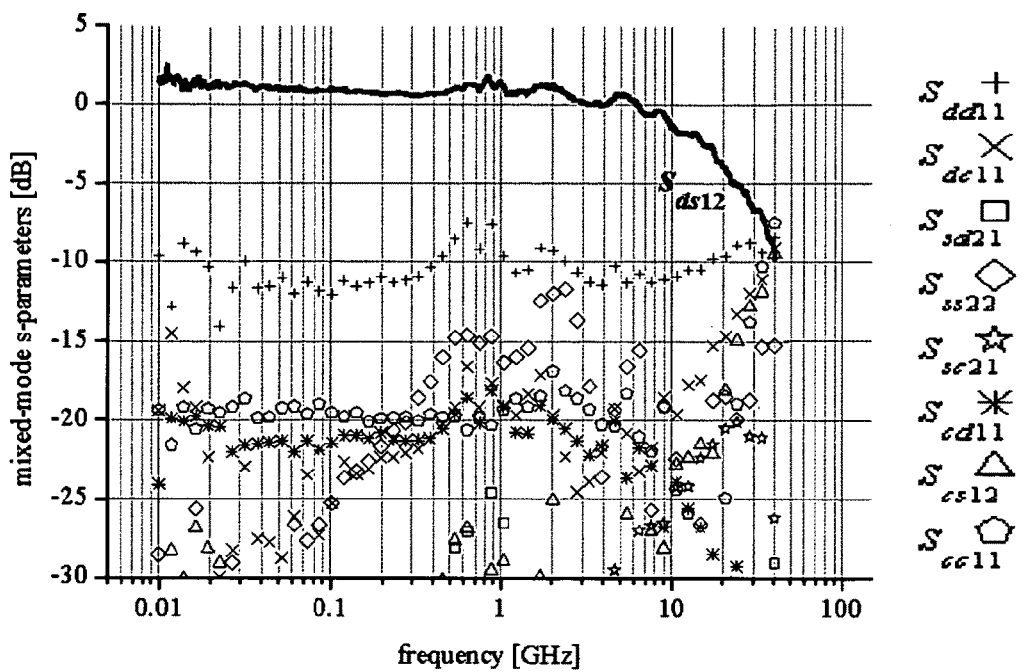
FIG. 14 shows a plot of mixed-mode s-parameter measurements of the C3-balun according to an embodiment of the present invention at −25 dBm input.
Figure 15:
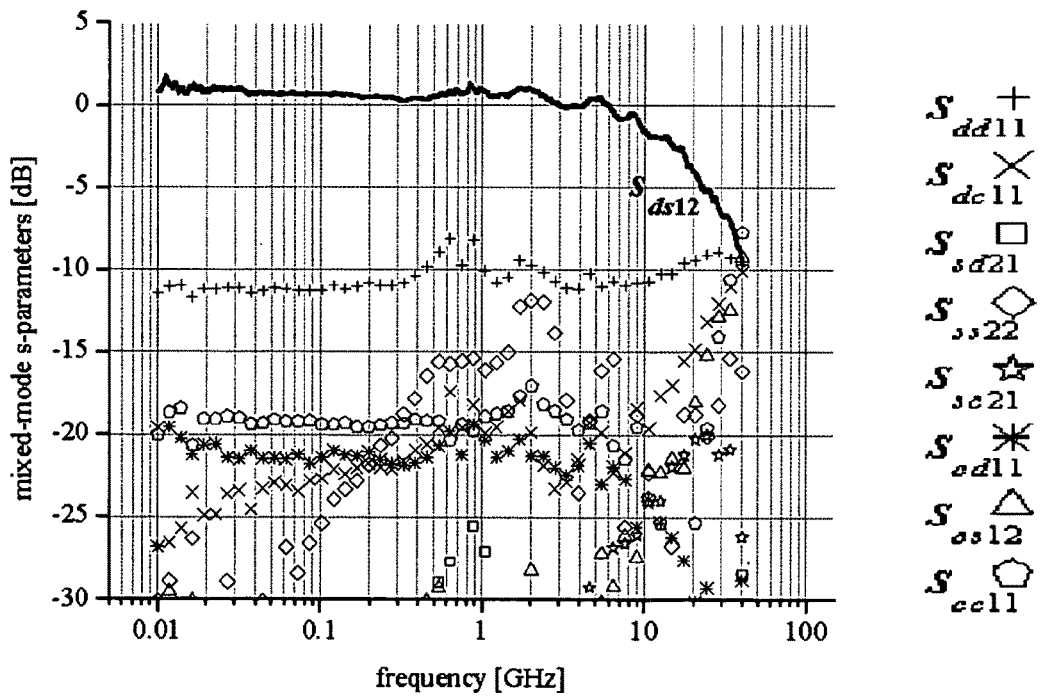
FIG. 15 shows a plot of mixed-mode s-parameter measurements of the C3-balun according to an embodiment of the present invention at 5 dBm input.

The measured mixed-mode s-parameters are shown in FIG. 14 and FIG. 15 for the input power of −25 dBm and 5 dBm, respectively. The forward differential gains in the two graphs show virtually the same results, which illustrates that the subject C3-balun can maintain its linearity for the input as high as 5 dBm. The other undesired s-parameters such as reflections and isolations are all under −10 dB tip to 30 GHz, except for $s_{dd11}$ during the frequency range 0.4 GHz~1 GHz and 20 GHz~30 GHz, where it becomes as high as −6.1 dB. This is due to the constructive interference of the single-ended reflections shown in FIG. 12, which was neglected during the simulation-level design stage of monitoring only the single ended s-parameters. This can be addressed by monitoring the mixed-mode s-parameters as well, during the simulation-level design stage.

Table 2 shows the accuracies of the forward gains for various bandwidths where input power is −25 dBm~5 dBm.

TABLE 2

| Bandwidth | $|dB(s_{23})-dB(s_{13})|$ [dB] | $\angle(s_{23})-\angle(s_{13})$ [deg] | $dB(s_{ds12})$ [dB] |
|---|---|---|---|
| DC ~10 GHz | <1.1 | 173~184 | −1.5~1.8 |
| DC ~17 GHz | <1.8 | 170~184 | −2.7~1.9 |
| DC ~30 GHz | <9.4 | 170~188 | −6.8~1.9 |

Table 2 shows that the subject C3-balun can be used directly with high accuracy up to 10 GHz, and with the moderate accuracy up to 17 GHz. However, if the errors caused by the balun's imperfections can be calibrated out, the subject C3-balun can be used Up to 30 GHz. The applications beyond 30 GHz may be difficult due to the increase in the common and cross-mode errors of the balun, where they can cause critical measurement errors, even under the most accurate calibration conditions.

Figure 16:
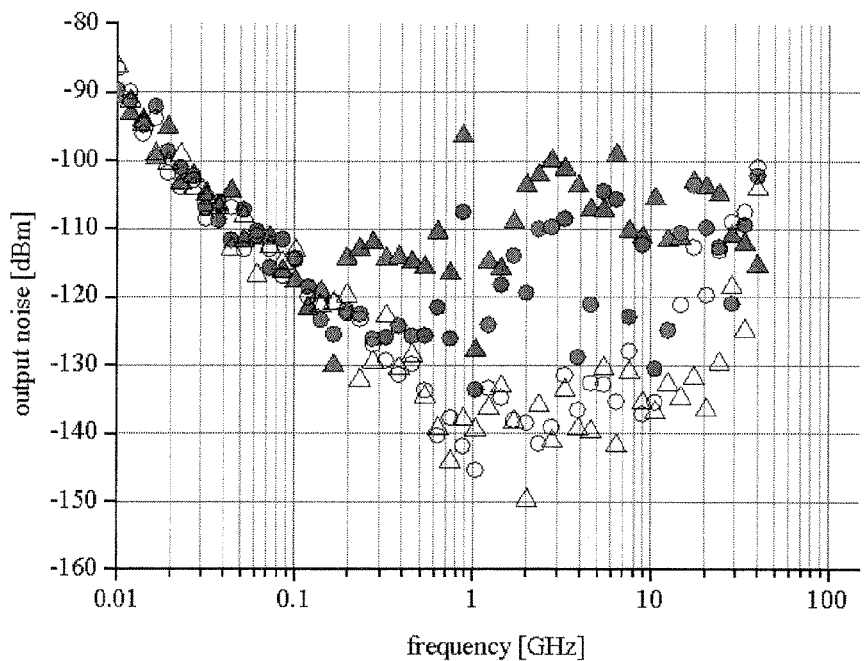
FIG. 16 shows a plot of noise measurements of the C3-balun according to an embodiment of the present invention; symbols "Δ" and "○" represent differential-mode and common-mode, respectively, where the filled symbols are the measured noise and the unfilled symbols are the VNA system's background noise.

For the noise measurements, the balun is characterized with differential noise using ZVA40 spectrum analyzer mode, by which a true-differential output powers can be measured. The measurements are shown in FIG. 16. Each frequency point is plotted with the average value obtained from repeated noise. Symbols "Δ" and "○" filled in gray respectively represent the output power's differential-mode and common-mode, at zero input (terminated with 50 Ω). This is compared with the unfilled symbols, which represent the system's background noise of the ZVA40. This comparison shows that the measured noises (the filled symbols) are only valid roughly in frequency range of 0.2 GHz~20 GHz. Within this valid frequency range the subject C3-balun showed low differential noise of less than −95 dBm. Note that in certain frequency range clusters, the differential-mode is shown to be at least 10 dB higher than that of the common-mode, which cannot be obtained by mathematically combining single-needed noise measurements.

EXAMPLE 2

Figure 17:
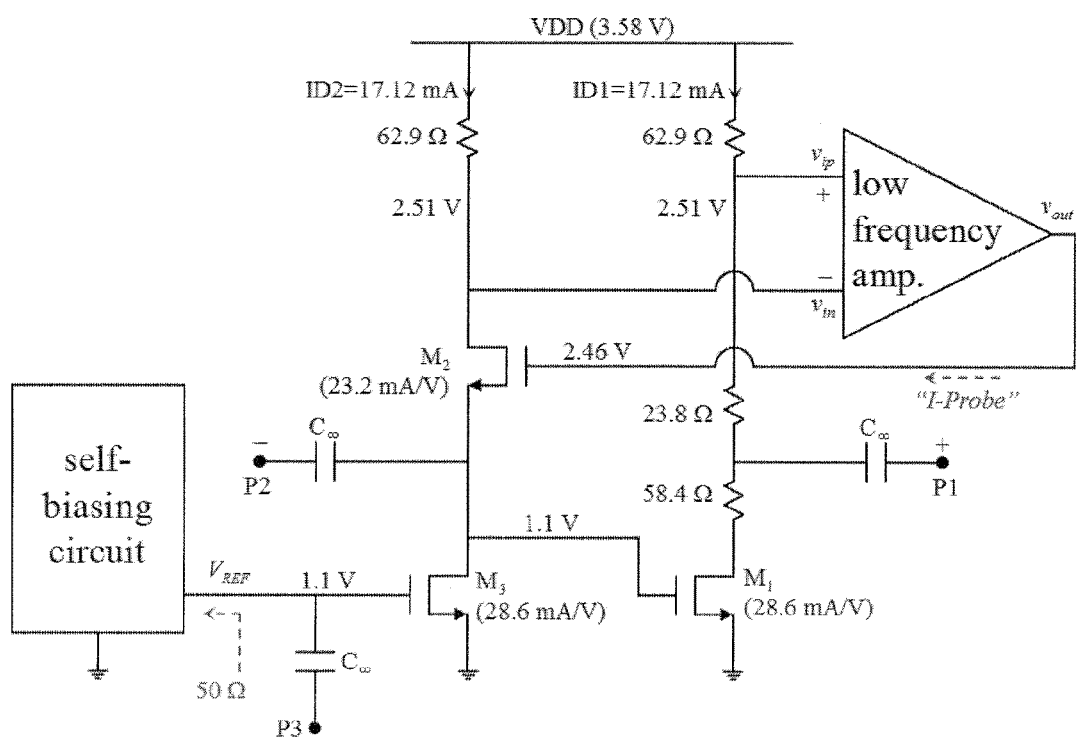
FIG. 17 shows a schematic of a specific implementation of the C3-balun with network for stable biasing shown in FIG. 2.

In a further example a low-pass bias-feedback mechanism can be incorporated in the C3-balun. As shown in FIG. 17, in a specific implementation, the drain currents of ID1 and ID2 are matched to 17.12 mA, and the lower-end terminals of the two 62.9 Ω resistors are connected to $v_{ip}$ and $v_{in}$. The low-pass bias-feedback network can control the matching of $s_{13}$ and $s_{23}$. The values of the matched magnitudes of $s_{13}$ and $s_{23}$ can then be maintained at −3 dB each by controlling the ID1 and ID2 bias currents using the self biasing circuit.

Figure 18:
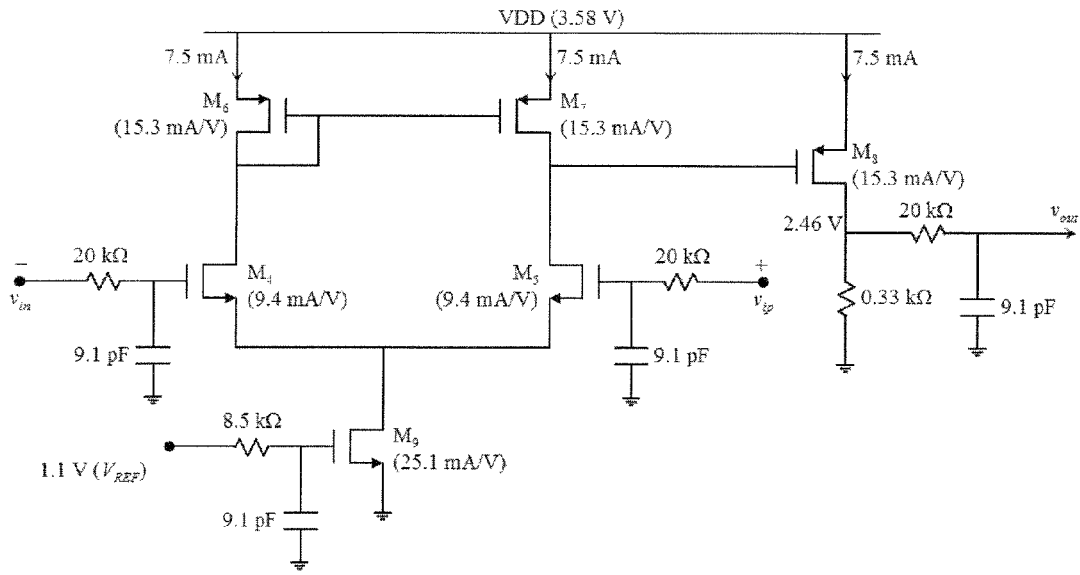
FIG. 18 shows a schematic of a specific implementation of the low frequency amplifier used for a low-pass bias-feedback network shown in FIG. 3.

The circuit diagram for the low-frequency amplifier is shown in FIG. 18. The matching of the drain currents enables the matching of the transconductances of $M_3$ and $M_1$, which results in the matching of $s_{13}$ and $s_{23}$ magnitudes.

Figure 19:
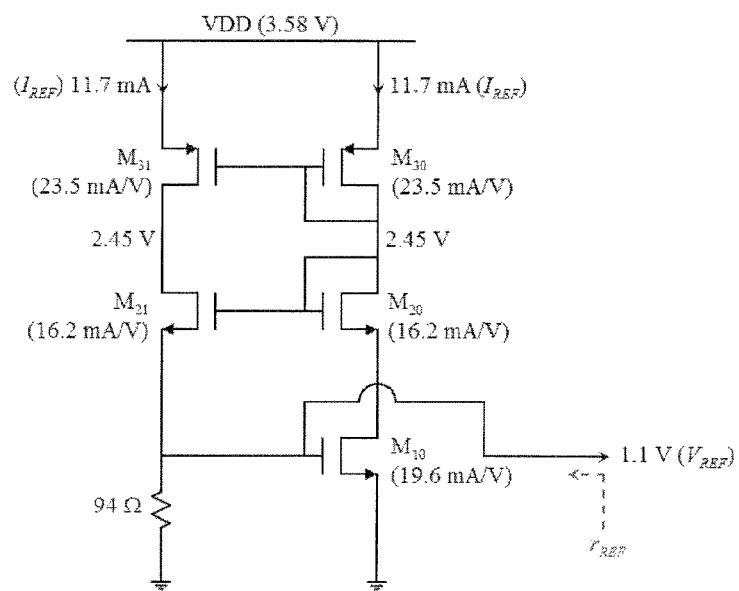
FIG. 19 shows a schematic of a specific implementation of the threshold-referenced self-biasing network shown in FIG. 4.

The low-pass bias-feedback network only controls the matching of $s_{13}$ and $s_{23}$ and not their values, which need to be maintained at −3 dB each. Since the values of the matched $s_{13}$ and $s_{23}$ depend on the matched bias currents of ID1 and ID2, these bias currents need to be well controlled. This is done by $I_{REF}$ of the attached self-biasing circuit, as shown in FIG. 19, which delivers $V_{REF}$ to the proposed C3-balun. According to the subject implementation, a constant VDD of 3.58 V can be applied. The C3-balun of FIG. 17 is designed using no inductors. Without the inductors, the subject C3-balun can operate in the frequency range from 10 MHz up to 10 GHz with the maximum input power of 0 dBm. However, the upper-end frequency can increase at least up to 17 GHz (as shown in the measurements from Example 1), by using on-chip inductors (connected in series with the 94 Ω in the self-biasing circuit shown in FIG. 19), and also by lowering the maximum input power to be less than 0 dBm. Further increase in the upper-end frequency can be achieved by sacrificing the lower-end frequency, allowing one to use internal DC-blocking capacitors by which the transistors' operational bias-points can be chosen independently from each other.

Figure 20A:
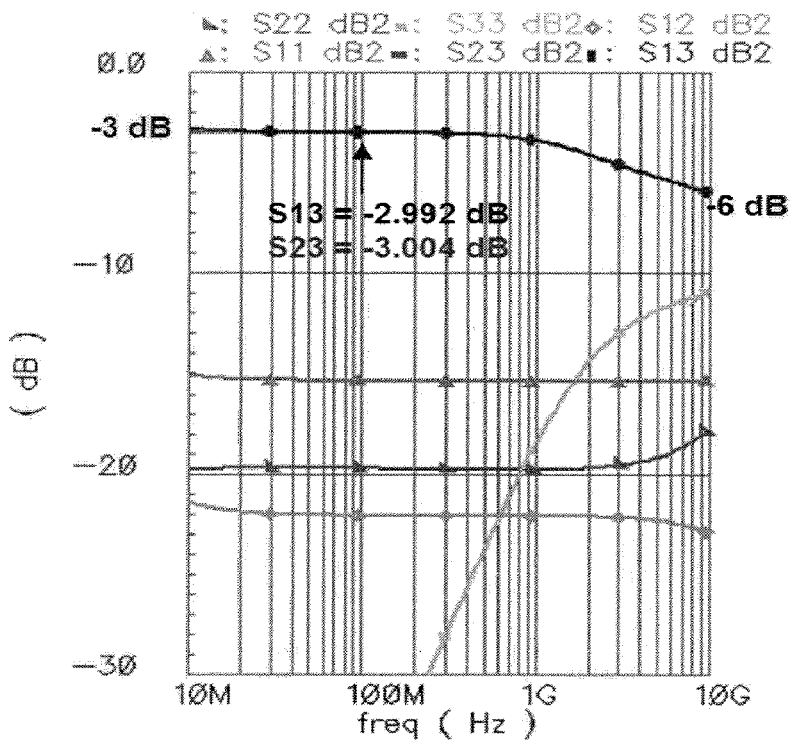
FIGS. 20A-20C show plots of overall performances of the C3-balun and the attached biasing network according to an embodiment of the present invention.
Figure 20B:
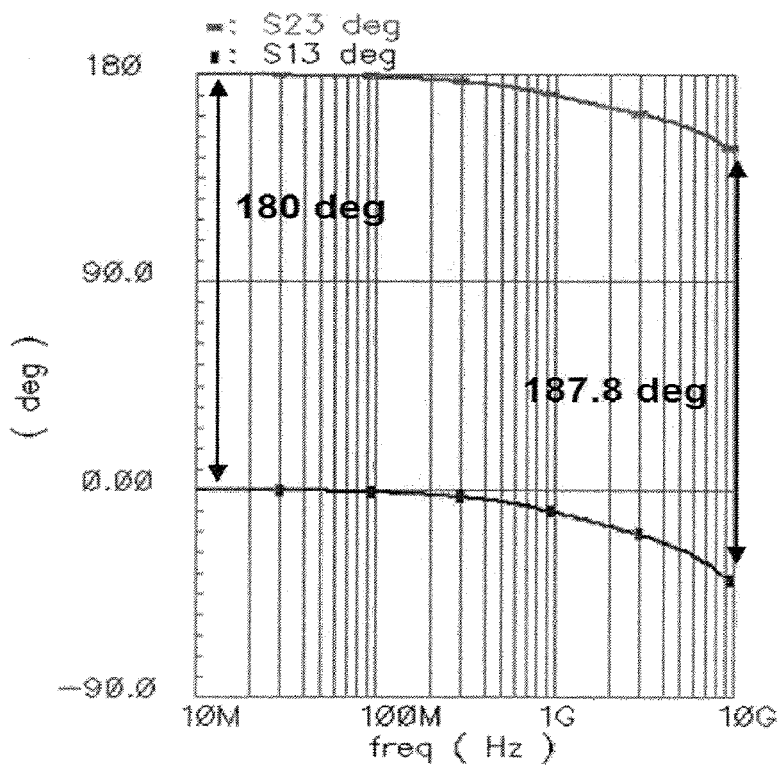
Figure 20C:
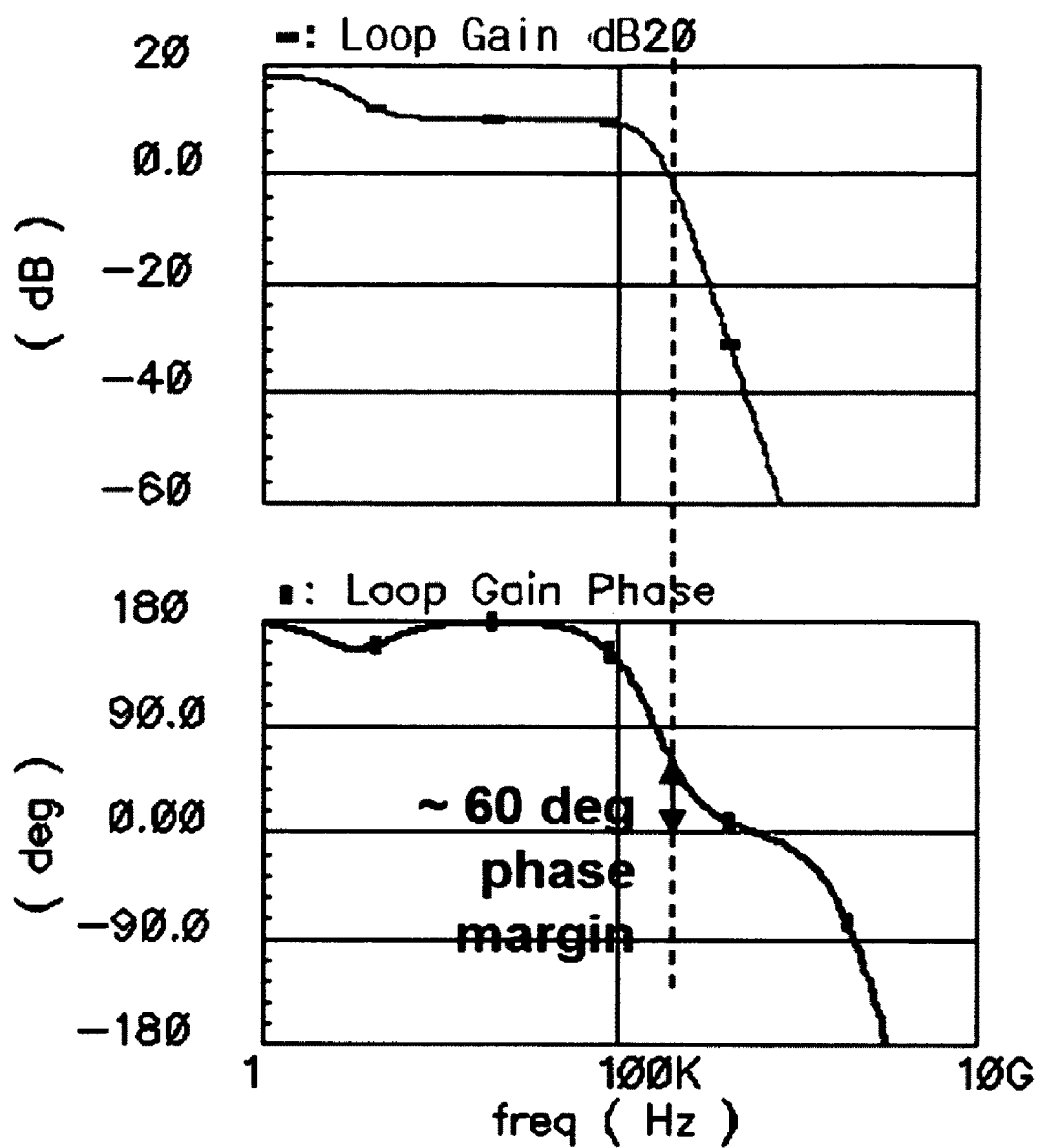

The overall performances of the C3-balun with the attached biasing network are shown in FIGS. 20A-20C, where the −3 dB bandwidth is up to 10 GHz. This figure also presents the stability response for the feedback branch "I-Probe" shown in FIG. 17, where the DC loop gain is 18 dB and the phase margin is 60°. The large DC loop gain enables the two bias points at $v_{ip}$ and $v_{in}$ to be matched, which results in the matched magnitudes of $s_{13}$ and $s_{23}$, as shown in Table 3. Table 3 provides the change of performances due to process variations.

TABLE 3

| Operation | 2% decrease in $M_1$ | 2% increase in $M_1$ | 2% decrease in $M_2$ | 2% increase in $M_2$ |
|---|---|---|---|---|
| ID1 [mA] | 17.13 mA | 17.11 mA | 17.09 mA | 17.15 mA |
| $s_{13}$ @ 0.1 GHz | −3.12 dB | −2.87 dB | −2.81 dB | −3.17 dB |
| ID2 [mA] | 17.15 mA | 17.09 mA | 17.12 mA | 17.12 mA |
| $s_{23}$ @ 0.1 GHz | −2.99 dB | −3.02 dB | −3.03 dB | −2.98 dB |
| $\angle s_{23} - \angle s_{13}$ @ 10 GHz | 187.60° | 187.81° | 187.76° | 187.77° |

Referring to Table 3, the results show that despite the ±2 % process variations in $M_1$ and $M_2$, the ID1 and ID2 maintains their values with in 0.35%, which results in the small change in the transmission gain of less than 0.36 dB.

Accordingly, implementations of an active balun are provided, which can operate with the input power as high as 5 dBm, and the bandwidth up to 17 GHz, where the imbalance of the differential output is less than 1.8 dB in amplitude and less then 10 degrees in phase. Stable biasing is also available by attaching a low-pass bias-feedback network. With the development of a calibration algorithm for unidirectional error-networks, embodiments of the subject active balun can be applied to the proposed measurement strategy due to their large bandwidth and compact size (as small as 0.2 mm×0.2 mm), which are far beyond what passive baluns can provide.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

All patents, patent applications, provisional applications, and publications referred to or cited herein are incorporated by reference in their entirety, including all figures and tables, to the extent they are not inconsistent with the explicit teachings of this specification.

It should be understood that the examples and embodiments described herein are for illustrative purposes only and that various modifications or changes in light thereof will be suggested to persons skilled in the art and are to be included within the spirit and purview of this application. In addition, any elements or limitations of any invention or embodiment thereof disclosed herein can be combined with any and/or all other elements or limitations (individually or in any combination) or any other invention or embodiment thereof disclosed herein, and all such combinations are contemplated with the scope of the invention without limitation thereto.

We claim:

1. An active balun, comprising:
   a first transistor operating in response to an input signal applied to a gate of the first transistor;
   a second transistor having a source connected to a drain of the first transistor, wherein a first output of the active balun is arranged at a drain of the second transistor;
   a third transistor having a gate connected to the drain of the first transistor, wherein a second output of the active balun is arranged at a drain of the third transistor; and
   a biasing resistor connected in series between the drain of the first transistor and the source of the second transistor.

2. The active balun according to claim 1, further comprising:
   a first resistor connected in series between the input signal and the gate of the first transistor;
   a second resistor connected at one end between the first resistor and the gate of the first transistor; and
   an inductor connected in series with the second resistor and a gate voltage signal for the first transistor.

3. An active balun, comprising:
   a first transistor operating in response to an input signal applied to a gate of the first transistor;
   a second transistor having a source connected to a drain of the first transistor, wherein a first output is arranged at the source of the second transistor;
   a third transistor having a gate connected to the drain of the first transistor, wherein a second output is arranged at a drain of the third transistor; a low pass bias-feedback network for providing process variation stability to the first transistor, second transistor and third transistor; and
   a self biasing circuit connected to the gate of the first transistor.

4. An active balun, comprising:
   a first transistor operating in response to an input signal applied to a gate of the first transistor;
   a second transistor having a source connected to a drain of the first transistor, wherein a first output is arranged at the source of the second transistor;
   a third transistor having agate connected to the drain of the first transistor, wherein a second output is arranged at a drain of the third transistor; and
   a low frequency amplifier,
   wherein a negative input of the low frequency amplifier is connected between the drain of the second transistor and a lower terminal of a first VDD resistor connected to a VDD voltage,
   wherein a positive input of the low frequency amplifier is connected to a lower terminal of a second VDD resistor connected to the VDD voltage, the second VDD resistor disposed to be connected with the drain of the third transistor, and
   wherein an output of the low frequency amplifier is connected to a gate of the second transistor.

5. The active balun according to claim 4, wherein the low frequency amplifier comprises:
   a fourth transistor and a fifth transistor arranged as a differential pair;
   a current mirror load connected to the fourth and fifth transistors using a sixth transistor and a seventh transistor;
   a source biasing reference transistor connected to the fourth and fifth transistors; and
   an output buffer.

6. The active balun according to claim 4, further comprising:
a self biasing circuit connected to the gate of the first transistor.

7. The active balun according to claim 6, wherein the self biasing circuit comprises an inductor in parallel with a threshold reference resistor and the gate of the first transistor.

8. The active balun according to claim 6, further comprising:
an inductor connected at one terminal to the gate of the first transistor.

9. A method of providing a differential signal from a single ended signal, comprising:
providing a first transistor operating in response to an input signal from the single ended signal applied to a gate of the first transistor;
providing a second transistor having a source connected to a drain of the first transistor, wherein a negative output of the differential signal is arranged at a drain or the source of the second transistor; and
providing a third transistor having a gate connected to the drain of the first transistor, wherein a positive output of the differential signal is arranged at a drain of the third transistor.

10. The method of providing a differential signal from a single ended signal according to claim 9, further comprising:
providing a low-pass bias-feedback network for process variation stability of the first transistor, second transistor and third transistor.

11. The method of providing a differential signal from a single ended signal according to claim 10, wherein the negative output of the differential signal is arranged at the source of the second transistor, wherein the low-pass bias-feedback network comprises:
a low frequency amplifier having a negative input node, a positive input node, and an output node,
wherein a loop is provided from the positive input node to the output node, from the output node to the second transistor as a source-follower configuration, from the second transistor to the third transistor as a common-source configuration, and from the third transistor back to the positive input node.

12. The method of providing a differential signal from a single ended signal according to claim 10, wherein the low-pass bias-feedback network comprises:
a self biasing circuit connected to the gate of the first transistor.

* * * * *

UNITED STATES PATENT AND TRADEMARK OFFICE
CERTIFICATE OF CORRECTION

PATENT NO. : 7,737,789 B2  Page 1 of 1
APPLICATION NO. : 12/253979
DATED : June 15, 2010
INVENTOR(S) : William Richard Eisenstadt, Kooho Jung and Robert M. Fox It is certified that error appears in the above-identified patent and that said Letters Patent is hereby corrected as shown below:

Column 1,
Line 60, "the FFTs," should read --the FETs,--.

Column 7,
Line 56, "tip to 30 GHz," should read --up to 30 GHz,--.

Column 8,
Line 8, "Up to 30 GHz," should read --up to 30 GHz,--.

Column 10,
Line 42, "having agate connected" should read --having a gate connected--.

Signed and Sealed this

Seventh Day of September, 2010

David J. Kappos
*Director of the United States Patent and Trademark Office*